(12) United States Patent
Lin et al.

(10) Patent No.: US 11,320,395 B2
(45) Date of Patent: May 3, 2022

(54) BIOFET AND METHOD OF MANUFACTURING THE SAME

(71) Applicant: Taiwan Semiconductor Manufacturing Co., Ltd., Hsinchu (TW)

(72) Inventors: Ching-Hui Lin, Taichung (TW); Chun-Ren Cheng, Hsin-Chu (TW); Jui-Cheng Huang, Hsinchu (TW); Shih-Fen Huang, Hsinchu (TW); Tung-Tsun Chen, Hsinchu (TW); Yu-Jie Huang, Kaohsiung (TW); Fu-Chun Huang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/900,989

(22) Filed: Jun. 14, 2020

(65) Prior Publication Data
US 2021/0389273 A1    Dec. 16, 2021

(51) Int. Cl.
*G01N 27/414* (2006.01)
*H01L 23/31* (2006.01)
(Continued)

(52) U.S. Cl.
CPC ..... *G01N 27/4148* (2013.01); *G01N 27/4145* (2013.01); *H01L 21/823475* (2013.01); *H01L 23/291* (2013.01); *H01L 23/3171* (2013.01); *H01L 23/5226* (2013.01); *H01L 23/647* (2013.01); *H01L 29/786* (2013.01)

(58) Field of Classification Search
None
See application file for complete search history.

(56) References Cited

U.S. PATENT DOCUMENTS

2014/0264467 A1 * 9/2014 Cheng ................ G01N 27/4148
257/253
2014/0264468 A1 * 9/2014 Cheng ................ G01N 27/4145
257/253
(Continued)

FOREIGN PATENT DOCUMENTS

WO    WO-2016112079 A1 *  7/2016   ......... G01N 27/4145

OTHER PUBLICATIONS

Silvia Ronchi et al., "Single-Cell Electrical Stimulation Using CMOS-Based High-Density Microelectrode Arrays." Front Neurosci, vol. 13, Article 208, Mar. 13, 2019, pp. 1-16.

*Primary Examiner* — Erik Kielin
(74) *Attorney, Agent, or Firm* — JCIPRNET (57) ABSTRACT

An integrated circuit device includes a device layer, an interconnect structure, a conductive layer, a passivation layer and a bioFET. The device layer has a first side and a second side and include source/drain regions and a channel region between the source/drain regions. The interconnect structure is disposed at the first side of the device layer. The conductive layer is disposed at the second side of the device layer. The passivation layer is continuously disposed on the conductive layer and the channel region and exposes a portion of the conductive layer. The bioFET includes the source/drain regions, the channel region and a portion of the passivation layer on the channel region.

20 Claims, 12 Drawing Sheets

(51) Int. Cl.
  *H01L 23/522* (2006.01)
  *H01L 23/64* (2006.01)
  *H01L 29/786* (2006.01)
  *H01L 21/8234* (2006.01)
  *H01L 23/29* (2006.01)

(56) References Cited

U.S. PATENT DOCUMENTS

2016/0209355 A1* 7/2016 Tseng ................... G01N 27/414
2016/0334362 A1* 11/2016 Liu ....................... H01L 23/345
2018/0172627 A1* 6/2018 Chang ............... H01L 29/78654

* cited by examiner

BIOFET AND METHOD OF MANUFACTURING THE SAME

BACKGROUND

Biosensors are devices for sensing and detecting biomolecules and operate on the basis of electronic, electrochemical, optical and mechanical detection principles. Biosensors that include transistors are sensors that electrically sense charges, photons, and mechanical properties of bio-entities or biomolecules. The sensor detects the concentration of bio-entities or biomolecules, or through interaction and reaction between specified reactants and bio-entities/biomolecules. Such biosensors are fast in signal conversion and can be manufactured using semiconductor processes and easily applied to integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
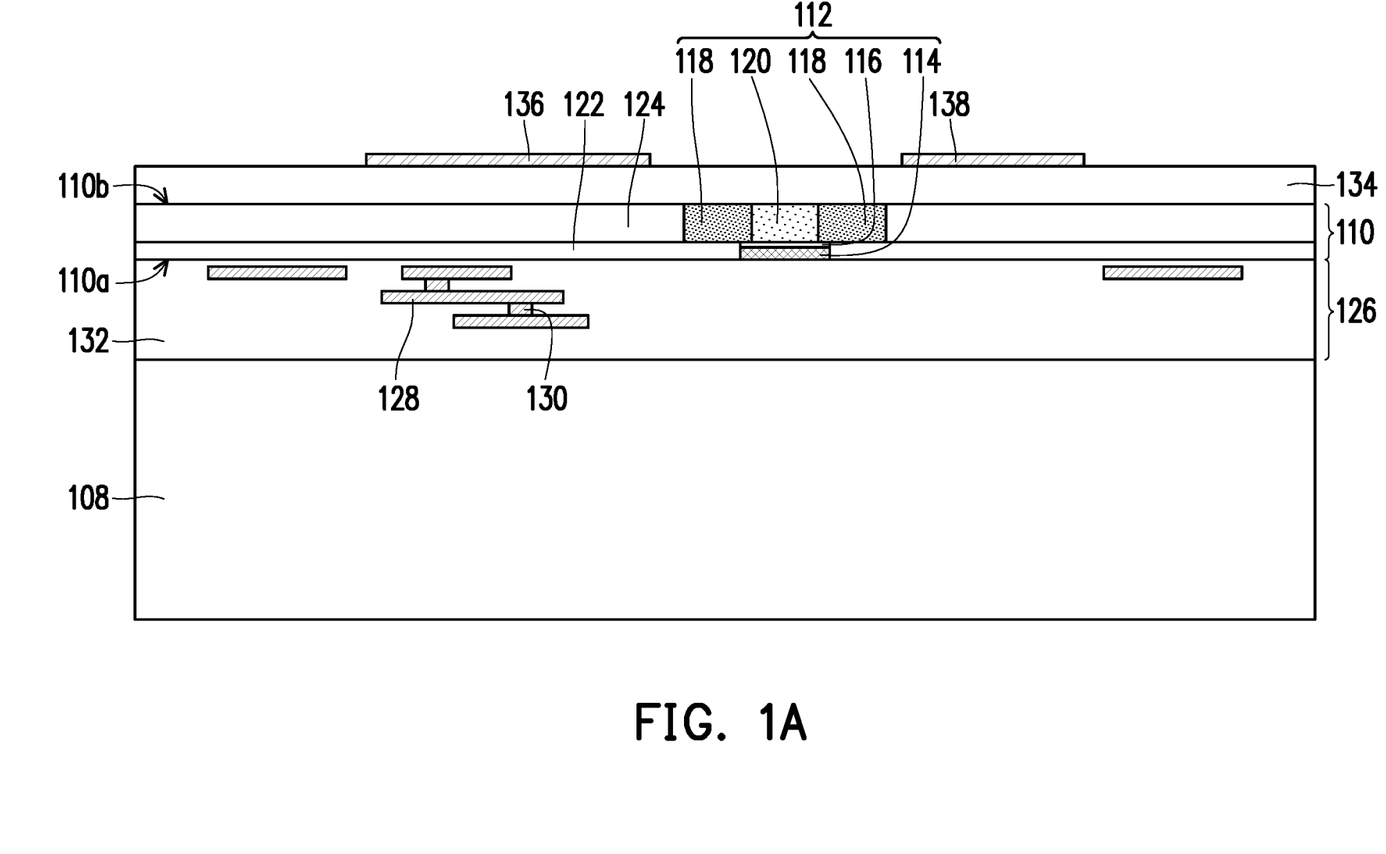
FIG. 1A to FIG. 1G are cross-sectional views of a method of manufacturing an integrated circuit device in accordance with some embodiments of the present disclosure.

FIG. 1A to FIG. 1G are cross-sectional views of a method of manufacturing an integrated circuit device in accordance with some embodiments of the present disclosure. Referring to FIG. 1A, a device layer 110 and an interconnect structure 126 are provided. In some embodiments, the device layer 110 and the interconnect structure 126 are disposed over a carrier 108. The carrier 108 may be a semiconductor carrier, a glass carrier, a quartz carrier or the like. The carrier 108 may provide structural stability during subsequent processing. In some embodiments, the carrier 108 provides interconnect features, contact bonding pads or the like.

The device layer 110 may be defined as a thin layer of an integrated circuit device including a semiconductor active layer and various devices that include components in the semiconductor active layer or in close proximity to the semiconductor active layer. The device layer 110 may be the portion of an integrated circuit device extending downward through a semiconductor active layer to the depth of the transistor channels and upward to the lower limit of an overlying metal interconnect structure. The device layer 110 may be approximately 1 µm or less in thickness. In some embodiments, the semiconductor active layer is approximately 200 nm or less in thickness. The semiconductor active layer includes a semiconductor. In some embodiments, the semiconductor active layer is formed from a single semiconductor crystal. In some embodiments, the semiconductor is silicon. Alternatively, the semiconductor may be another elementary semiconductor, such as germanium; a compound semiconductor such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, or GaInAsP; or a combination thereof. In some embodiments, the semiconductor active layer is doped to include n-doped regions and p-doped regions to provide a complementary metal oxide semiconductor device (CMOS). The semiconductor active layer may be divided into a plurality of electrically and thermally isolated regions by isolation regions. The isolation regions are dielectric. The dielectric may be an oxidized form of the semiconductor of the semiconductor active layer. In some embodiments, the isolation regions are shallow trench isolation regions.

In some embodiments, the device layer 110 includes a transistor 112 and an insulation layer 124 (also referred to as the insulation layer of the isolation regions). The transistor 112 includes a gate electrode 114, a gate dielectric layer 116, source/drain regions 118 and a channel region 120. The gate electrode 114 is disposed in a dielectric layer 122. In some embodiments, the gate electrode 114 includes polysilicon. In some alternative embodiments, the gate electrode 114 includes metal. The gate dielectric layer 116 is disposed over the gate electrode 114. In some embodiments, the gate dielectric layer 116 includes $SiO_2$. In some alternative embodiments, the gate dielectric layer 116 includes a high-k dielectric or other suitable dielectric. The gate electrode 114 and the gate dielectric layer 116 are collectively referred to as a conventional gate. The source/drain regions 118 are disposed on opposite sides of the gate electrode 114, and the channel region 120 is formed between the source/drain regions 118. The source/drain regions 118 and the channel region 120 are formed in a doped region of the semiconductor active layer, for example.

The device layer 110 has a first side 110a and a second side 110b opposite to the first side. The interconnect structure 126 is disposed at the first side 110*a* of the device layer 110. The interconnect structure 126 includes a plurality of interconnector layers. Each interconnector layer includes a plurality of conductive lines 128 in a dielectric layer 132. Adjacent interconnector layers are connected by conductive vias 130. In some embodiments, the conductive lines 128 are metal lines such as copper lines, and the conductive vias 130 are metal vias such as copper vias. The dielectric layer 132 may be a single-layered or multi-layered structure. The dielectric layer 132 includes a low-k dielectric, an extremely low-k dielectric which is a low-k dielectric having porosity or air gaps that significantly reduce electrical and thermal conductivity, or the like.

In some embodiments, the interconnector layers of the interconnect structure 126 are scaled. Scaling is done by varying thickness and width of the conductive lines 128 among the interconnector layers. The lowest interconnect layers, which are closest to the device layer 110, have the thinnest and narrowest conductive lines 128. The conductive lines 128 in the lowest interconnect layers have the highest RC delay and can be used to make local interconnections. In a scaled multilayer interconnect structure 126, wire thicknesses, widths, and separations gradually increase as additional interconnect layers are added. The topmost interconnect layers have the thickest, widest, and most coarsely spaced conductive lines 128. The uppermost layers have the lowest RC delay and can be used for power and clock distribution and for global signal routing. In some embodiments, the structure including the device layer 110 and the interconnect structure 126 is also referred to as a CMOS chip or a CMOS platform.

In some embodiments, a dielectric layer 134 is disposed at the second side 110*b* of the device layer 110. The dielectric layer 134 may be approximately 0.1 μm to 1 μm in thickness. In some embodiments, the dielectric layer 134 may include silicon oxide, silicon nitride, or silicon oxynitride. The dielectric layer 134 may be formed using a suitable process, such as atomic layer deposition (ALD), chemical vapor deposition (CVD), physical vapor deposition (PVD), thermal oxidation, UV-ozone oxidation, or a combination thereof.

Then, a first conductive layer 136 and a second conductive layer 138 are formed over the dielectric layer 134. The first conductive layer 136 and the second conductive layer 138 are also referred to as on-chip electrode. In some embodiments, the first conductive layer 136 and the second conductive layer 138 are disposed at opposite sides of the transistor 112. In some embodiments, the first conductive layer 136 and the second conductive layer 138 are electrically connected by the interconnect structure 126. The first conductive layer 136 and the second conductive layer 138 may be formed by forming a conductive material on the dielectric layer 134, and then patterning the conductive material. The first conductive layer 136 and the second conductive layer 138 may be approximately 20 nm to 500 nm in thickness. In some embodiments, a material of the first conductive layer 136 and the second conductive layer 138 may include metals with bio-compatibility and/or high thermal coefficient of resistance such as Pt, Au, Zn, Cu, Al, Ru, Rh, Pd, Os, Ir, Ag, W, Sn, Fe, Ni and Li. In some embodiments, the thermal coefficient of resistance of the material is larger than 0.003. The first conductive layer 136 and the second conductive layer 138 may be formed simultaneously or separately. In an embodiment in which the first conductive layer 136 and the second conductive layer 138 are formed simultaneously by using the same mask, a material with both bio-compatibility and high thermal coefficient of resistance such as Pt is applied. In an embodiment in which the first conductive layer 136 and the second conductive layer 138 are formed separately by using different masks, a material with bio-compatibility and another material with high thermal coefficient of resistance are used. The first conductive layer 136 and the second conductive layer 138 may be formed using a deposition process such as deposition process using E-gun, sputtering process, electroplating process and screen printing process and then a patterning process such as lift-off process, ion beam etching process, reactive-ion etching process and wet etching process.

Figure 1B:
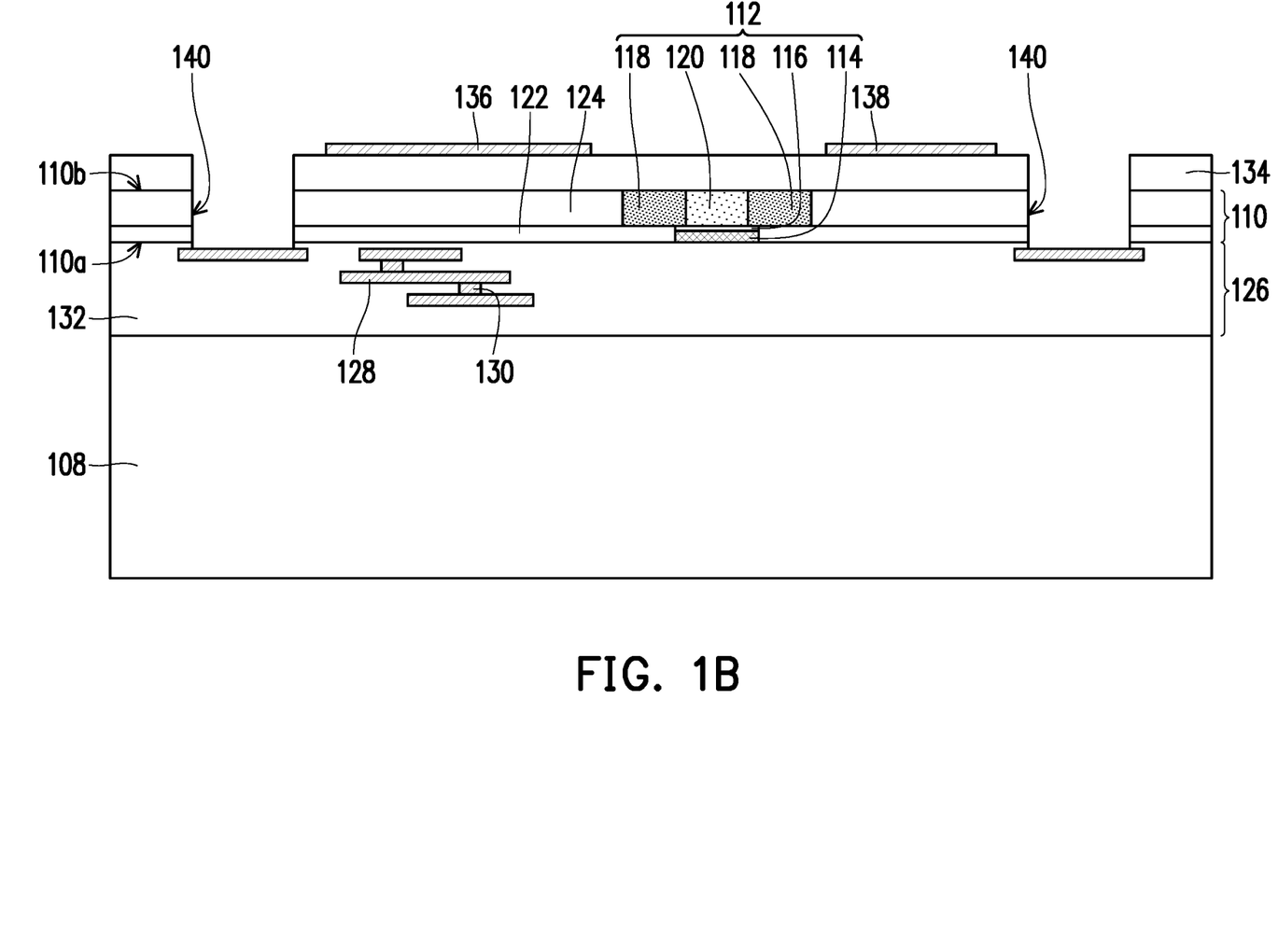

Referring to FIG. 1B, a plurality of openings 140 are formed to expose portions of the interconnect structure 126. In some embodiments, portions of the dielectric layer 132, the dielectric layer 122 and the insulation layer 124 are removed, so as to form the openings 140 in the dielectric layer 132, the dielectric layer 122 and the insulation layer 124. The openings 140 may be formed by lift-off process, ion beam etching process, reactive-ion etching process, wet etching process or other suitable method. A temperature of the process may be in a range of ambient to 100° C. In some embodiments, widths of the openings 140 are in a range of about 0.1 μm to about 10 μm, and depths of the openings 140 are in a range of about 0.1 μm to about 10 μm.

Figure 1C:
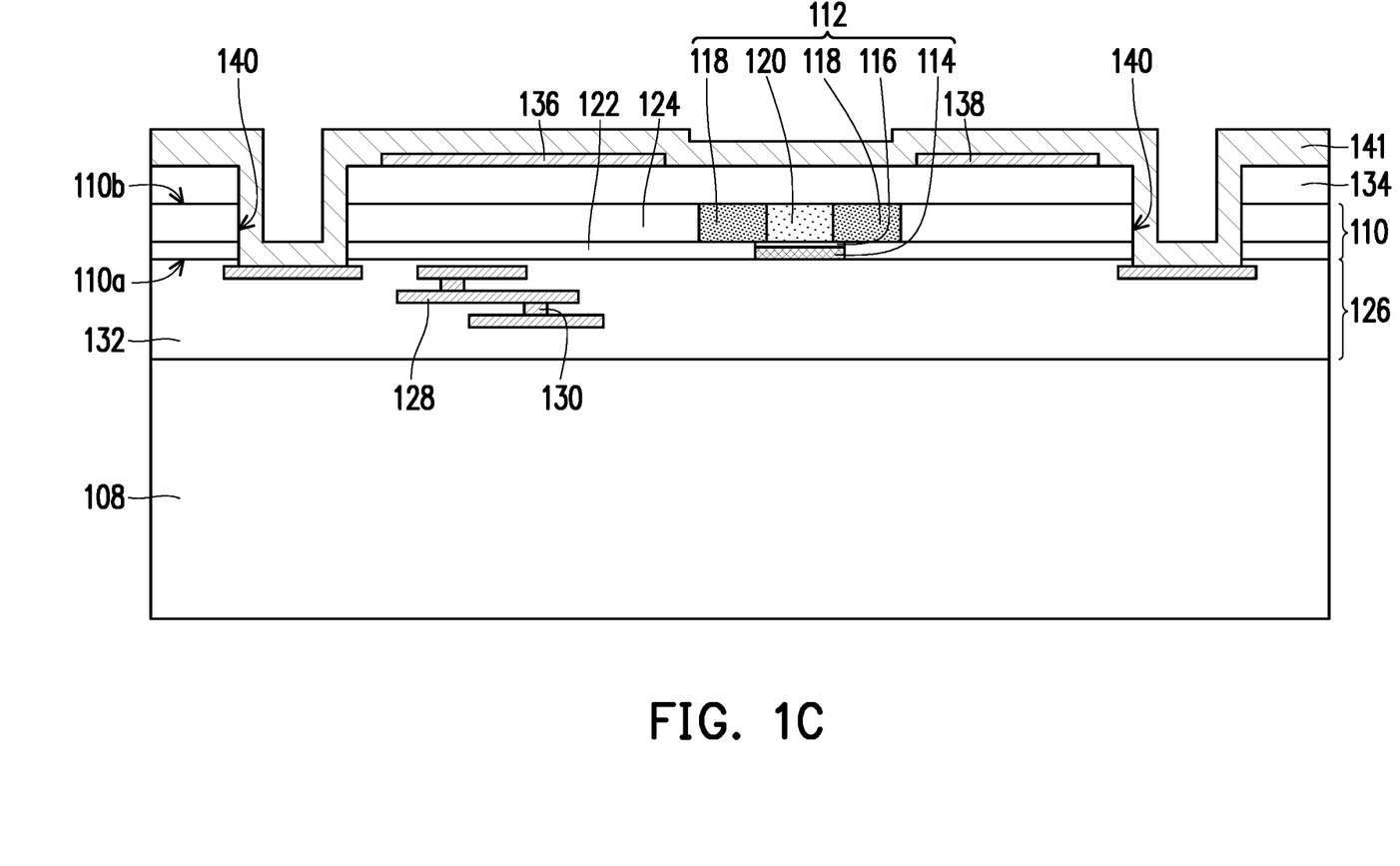

Referring to FIG. 1C, a conductive material 141 is formed over the device layer 110. In some embodiments, the conductive material 141 is formed on a top surface of the dielectric layer 134 and surfaces of the openings 140. For example, the conductive material 141 are conformally formed on sidewalls and bottoms of the openings 140. In other words, the opening 140 is not completely filled by the conductive material 141. In some embodiments, the conductive material 141 may include metal such as include copper, aluminum, titanium, tungsten, alloys thereof, composites thereof, and a combination thereof. For example, the conductive material 141 include aluminum-copper alloys. The conductive material 141 may have a thickness in a range of 1000 nm to 5000 nm. The conductive material 141 may be formed using a suitable process, such as deposition process using E-gun, sputtering process, electroplating process and screen printing process.

Figure 1D:
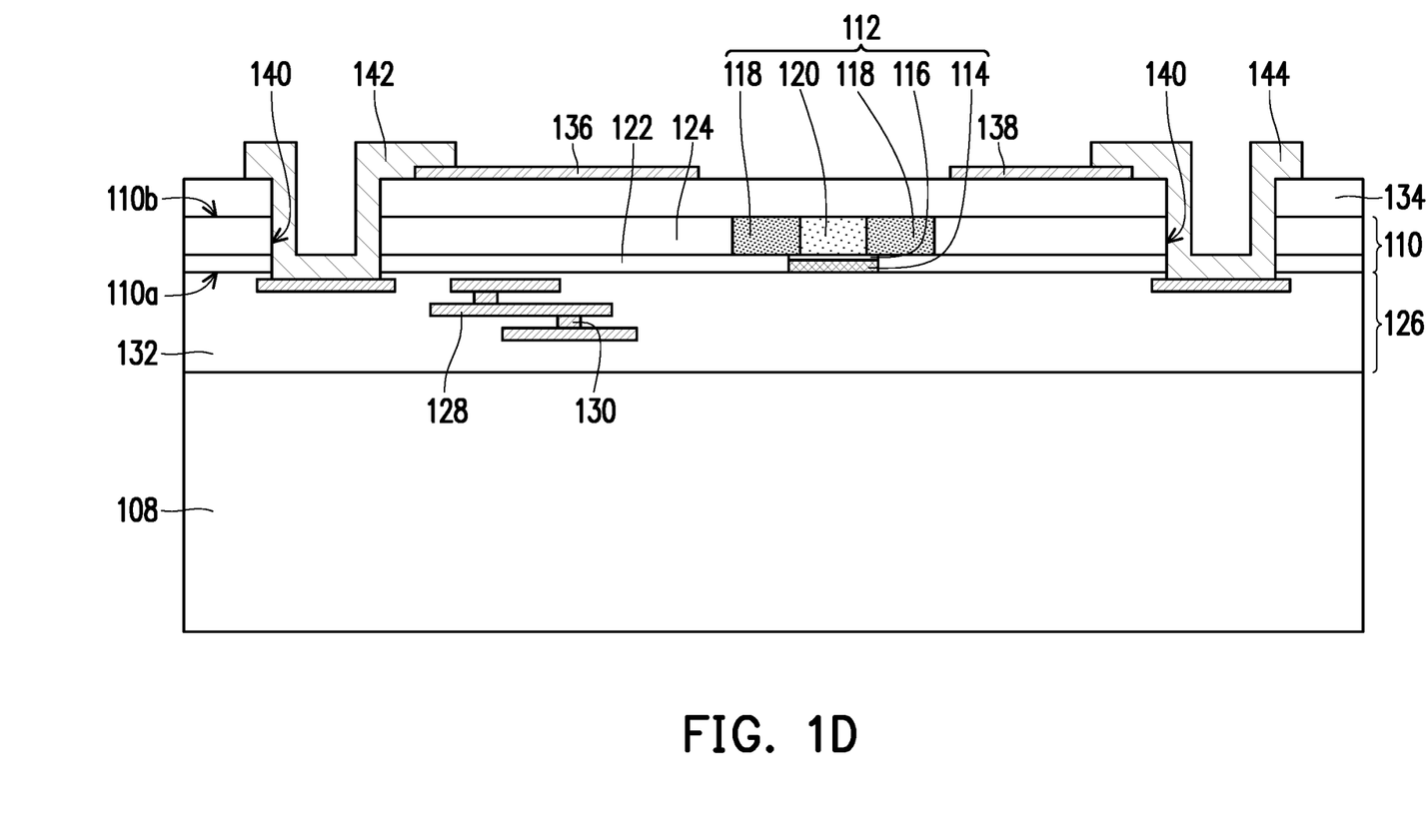

Referring to FIG. 1D, the conductive material 141 is patterned to form a plurality of bonding pads 142, 144 in the openings 140. The bonding pad 142, 144 is electrically connected to the conductive line 128 of the interconnect structure 126. In some embodiments, the bonding pad 142, 144 is conformally formed on the sidewall and the bottom of the opening 140. The bonding pad 142, 144 may be continuously disposed on sidewalls of the dielectric layer 132, the dielectric layer 122, the insulation layer 124 and the dielectric layer 134 and a top surface of the conductive line 128 and extended onto portions of the top surface of the dielectric layer 134. The bonding pad 142 is electrically connected to the first conductive layer 136, and the bonding pad 144 is electrically connected to the second conductive layer 138. For example, the bonding pad 142 is extended onto the first conductive layer 136 to be in contact with the first conductive layer 136. Similarly, the bonding pad 144 is extended onto the second conductive layer 138 to be in contact with the first conductive layer 136. In other words, an edge of the bonding pad 142 is overlapped with an edge of the first conductive layer 136, and an edge of the bonding pad 144 is overlapped with an edge of the second conductive layer 138. Therefore, the first conductive layer 136 is electrically connected to the interconnect structure 126 through the bonding pad 142, and the second conductive layer 138 is electrically connected to the interconnect structure 126 through the bonding pad 144. The conductive material 141 may be formed using a suitable process, such as lift-off process, ion beam etching process, reactive-ion etching process, wet etching process or other suitable method.

Figure 1E:
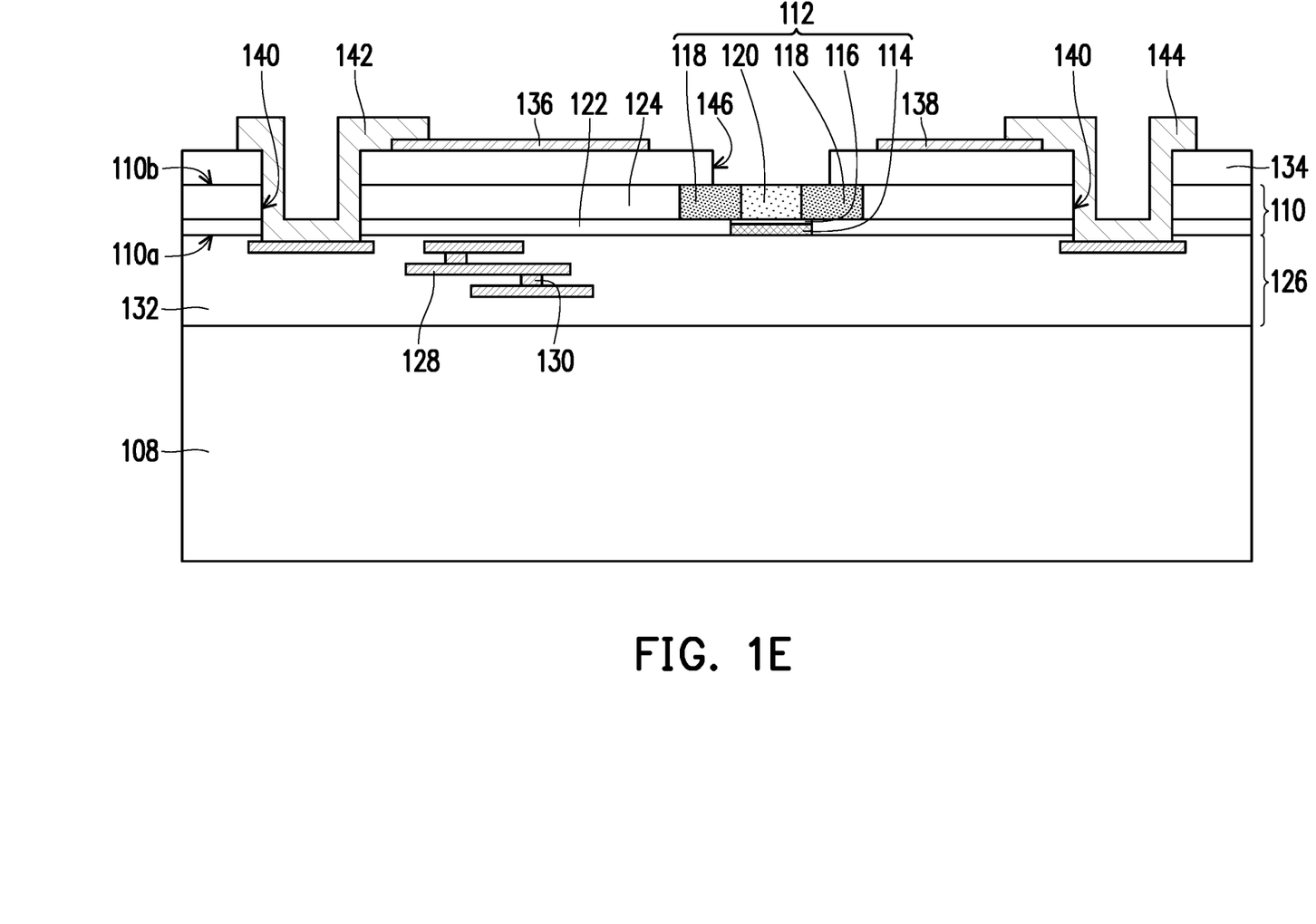

Referring to FIG. 1E, a well 146 is formed in the dielectric layer 134 to expose the transistor 112. For example, the well 146 exposes portions of the source/drain regions 118 and the channel region 120. In some embodiments, a width of the well 146 is in a range of about 0.1 μm to about 1 μm, and a depth of the well 146 is in a range of about 0.1 μm to about 1 μm.

Figure 1F:
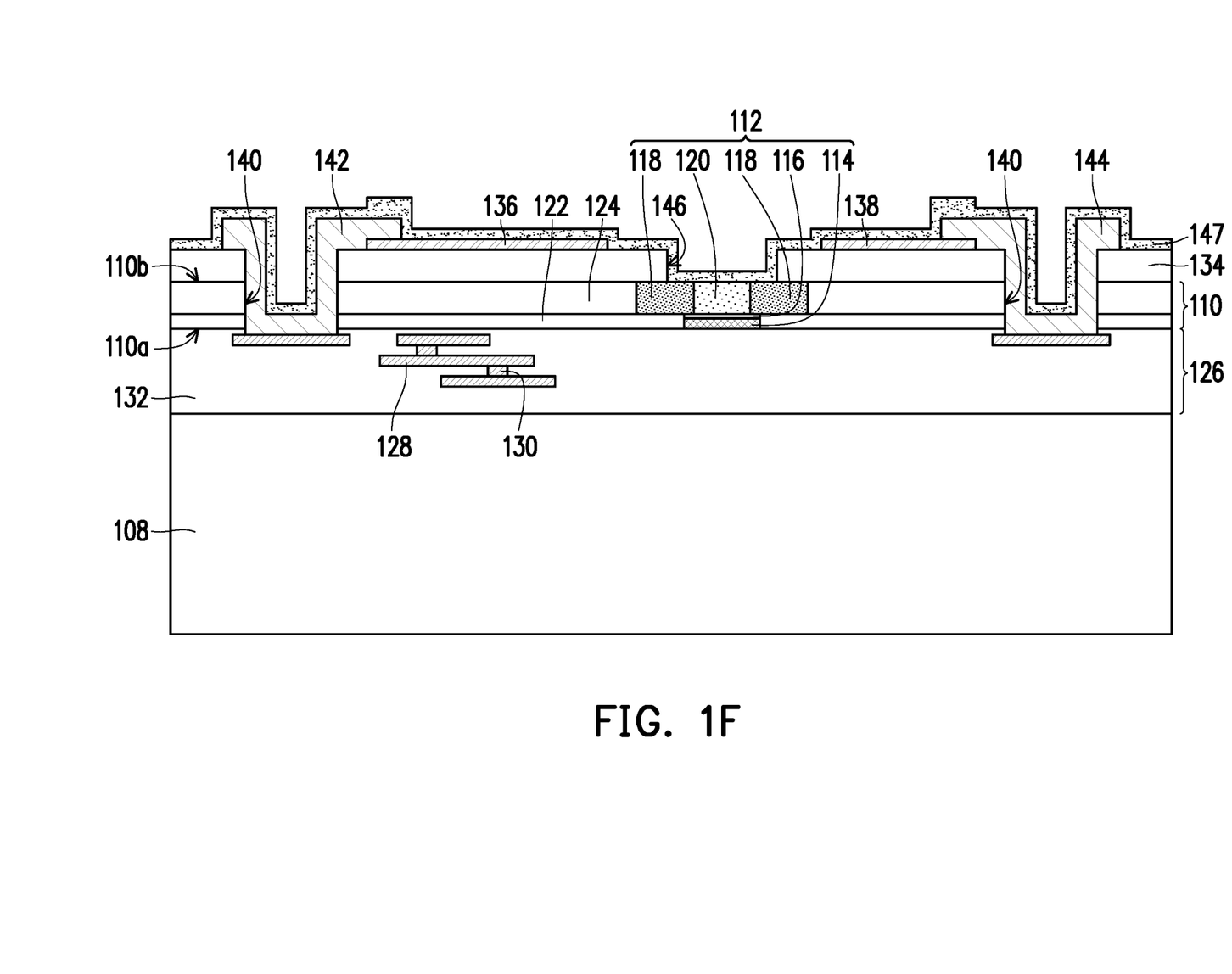

Referring to FIG. 1F, a passivation material 147 is formed over the device layer 110. In some embodiments, the passivation material 147 is conformally formed on surfaces of the dielectric layer 134, the bonding pads 142, 144, the first conductive layer 136 and the second conductive layer 138. As shown in FIG. 1F, the passivation material 147 is extended into the opening 140 to dispose on the bonding pads 142, 144. In addition, the passivation material 147 is extended into the well 146 and continuously and conformally formed on a sidewall and a bottom of the well 146. The passivation material 147 may be in a range of approximately 1 nm to 100 nm. In some embodiments, the passivation material 147 may include and ion-sensing materials such as $SiO_2$, $Al_2O_3$, $Ta_2O_5$, $HfO_2$, $Si_3N_4$, $Y_2O_3$, $ZrO_2$, $TiO_2$, $La_2O_3$, dielectrics with high dielectric constant or a combination thereof. The passivation material 147 is formed using a suitable process, such as atomic layer deposition (ALD), chemical vapor deposition (CVD), physical vapor deposition (PVD), or a combination thereof.

Figure 1G:
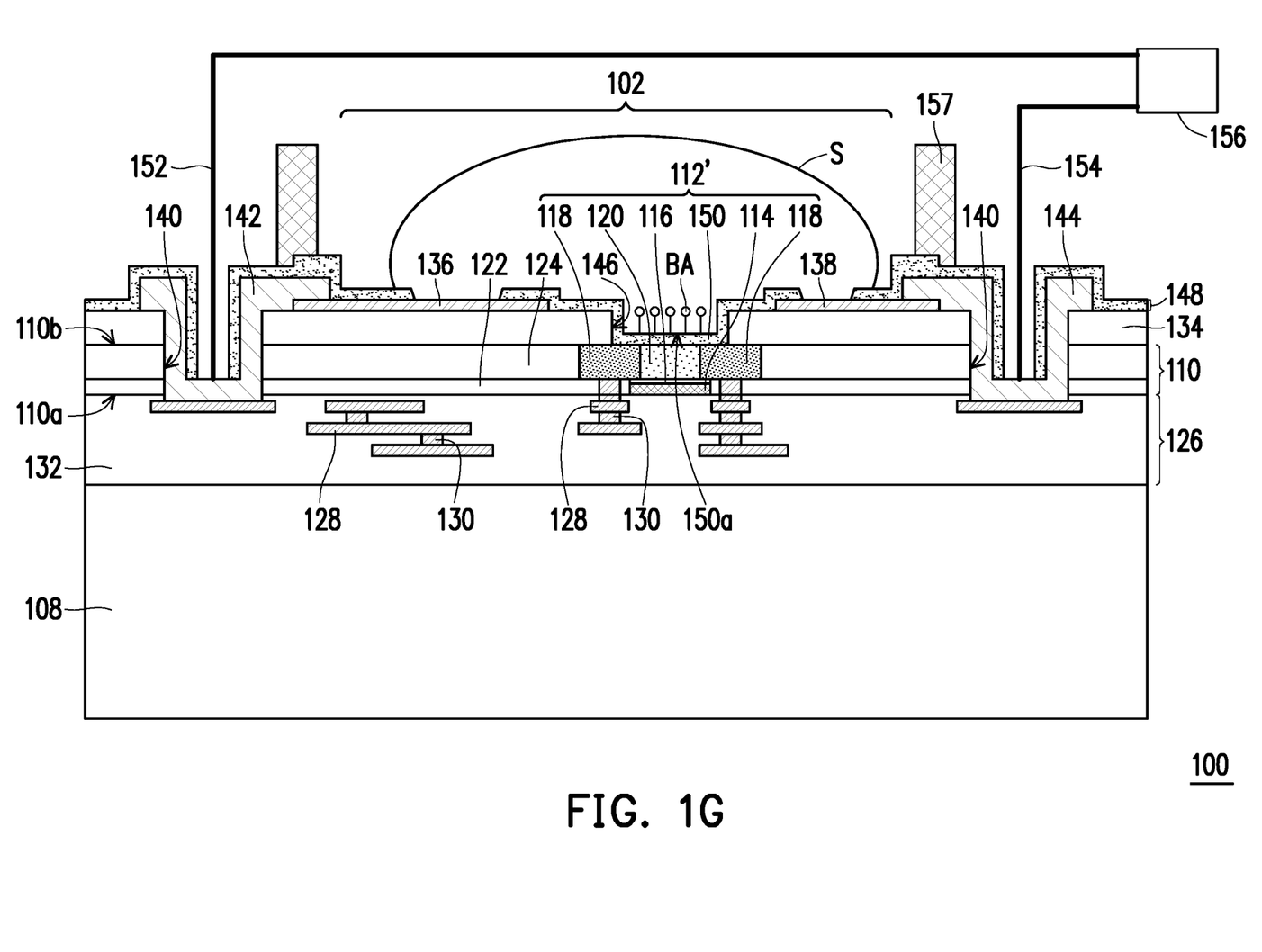

Referring to FIG. 1G, the passivation material 147 is patterned to form a passivation layer 148. The passivation layer 148 expose a portion of the bonding pad 142, 144. In some embodiments, a wire 152, 154 may be electrically connected to the portion of the bonding pad 142, 144 exposed by the passivation layer 148, and the wire 152, 154 may be further electrically coupled to a controller 156. In addition, the passivation layer 148 exposes a portion of the first conductive layer 136 and a portion of the second conductive layer 138. In some embodiments, a portion of the passivation layer 148 is continuously disposed on the first conductive layer 136 and the second conductive layer 138. The passivation layer 148 may be formed using a suitable process, such as lift-off process, ion beam etching process, reactive-ion etching process, wet etching process or other suitable method. In some embodiments, an integrated circuit device 100 is formed and designed to have a plurality of device regions 102 to receive fluid samples S in the form of micro-droplets. In such embodiments, the integrated circuit device 100 may further include a tank 157 to surround the device region 102.

In some embodiments, a portion of the passivation layer 148 is disposed over the channel region 120. As mentioned before, the passivation layer 148 includes ion-sensing material, and thus the passivation layer 148 over the channel region 120 itself serves as an ion-sensing film. The ion-sensing film becomes charged when brought in contact with an aqueous solution having a suitable ion concentration. Moreover, the ion-sensing film may become sufficiently charged to switch the source/drain conductivity. Thus, after forming the passivation layer 148 over the transistor 112, a bioFET 112' is formed. The bioFET 112' includes the source/drain regions 118, the channel region 120, the gate electrode 114, the gate dielectric layer 116 and a fluid gate dielectric layer 150. The fluid gate dielectric layer 150 is the portion of the passivation layer 148 directly over the channel region 120. The fluid gate dielectric layer 150 is in contact with the channel region 120, for example. In some embodiments, the bioFET 112' is a dual gate transistor having the conventional gate (i.e., a gate including the gate electrode 114 and the gate dielectric layer 116) and the fluid gate opposite to the conventional gate (i.e., a gate including the gate dielectric layer 116). In some embodiments, the conventional gate may be operative to modulate the response of the bioFET 112' to charge on the fluid gate.

In some embodiments, the bioFET 112' includes a fluid interfacing surface 150a. In some embodiments, the fluid interfacing surface 150a includes a coating of a selective binding agent BA. The selective binding agent BA is a biological composition having the property of selectively binding with a particular analyte. Many biological molecules and structures are charged. If a sufficient concentration of the analyte is bound on the fluid interfacing surface 150a, the overall charge concentration at the fluid interfacing surface 150a can become sufficient to modulate the source to drain conductivity of the bioFET 112'. In some embodiments, the binding agent BA includes an antibody. In some embodiments, the binding agent BA includes a single stranded nucleic acid. In some embodiments, the binding agent BA includes an epitope that is the target of certain antibodies.

As shown in FIG. 1G, the first conductive layer 136 and the second conductive layer 138 are integrated on the CMOS platform (also referred to as a bioFET platform). In some embodiments, one of the first conductive layer 136 and the second conductive layer 138 may be a heater, and the other of the first conductive layer 136 and the second conductive layer 138 may be a temperature sensor. The heater is operable to control the temperature of a droplet having a height in the range from approximately 25 to approximately 100 μm or having a volume in the range from approximately 50 μL to 500 μL. This and like functional limitations assume a separate droplet is provided for each independent device region 102. Temperature control may include heating and cooling. In some embodiments, the carrier 108 is structured to facilitate rapid cooling when heating discontinues.

High heating rates are desirable both to overcome cooling effects and to rapidly take liquid samples to desired temperatures. In some embodiments, the heater is operative to heat liquid in the device region 102 to 20° C. above ambient. In some of these embodiments, the heater is operative to heat liquid in the device region 102 to 60° C. above ambient. In some embodiments, the heater is operative to heat liquid in the device region 102 at a rate of 50° C./s or more. In some embodiments, the heater is operative to heat liquid in the device region 102 at a rate of 100° C./s or more. In some embodiments, the heater is operative to heat liquid in the device region 102 at a rate of 200° C./s or more.

The heater may be a resistive element coupled to a suitable current supply. In some embodiments, the heater is supplied with current through the interconnect structure 126. To provide the desired heating rate while limiting current density, in some embodiments the sheet resistance of the heater is in the range from approximately 0.1Ω/□ to 100Ω/□. In some embodiments, the sheet resistance of the heater is at least 1Ω/□. In some embodiments, the sheet resistance of the heater is at least 5Ω/□.

The temperature sensor may be an electrode type-sensor. The output queried may be voltage, current, or resistance. In some embodiments, the second conductive layer 138 measures the temperature according to a relationship between the resistance and the temperature. In some embodiments, the temperature sensor is coupled to analog to a digital converters (ADCs) on the integrated circuit device 100, whereby the integrated circuit device 100 is operable to provide a digital output from the temperature sensor.

The first conductive layer 136 and the second conductive layer 138 may be connected to a power source (not shown) in any suitable fashion. In some embodiments, the first conductive layer 136 and the second conductive layer 138 may be coupled directly to the external wire (not shown) similar to the wires 152, 154. Powering the first conductive layer 136 and the second conductive layer 138 externally allow the first conductive layer 136 and the second conductive layer 138 to be powered with high voltages. In some embodiments, the integrated circuit device 100 includes a plurality of distinct bonding pads (such as the bonding pads 142, 144) for distinct groups of the first conductive layer 136 and the second conductive layer 138. In some embodiments, distinct power source is used to provide power at distinct frequencies.

Figure 2:
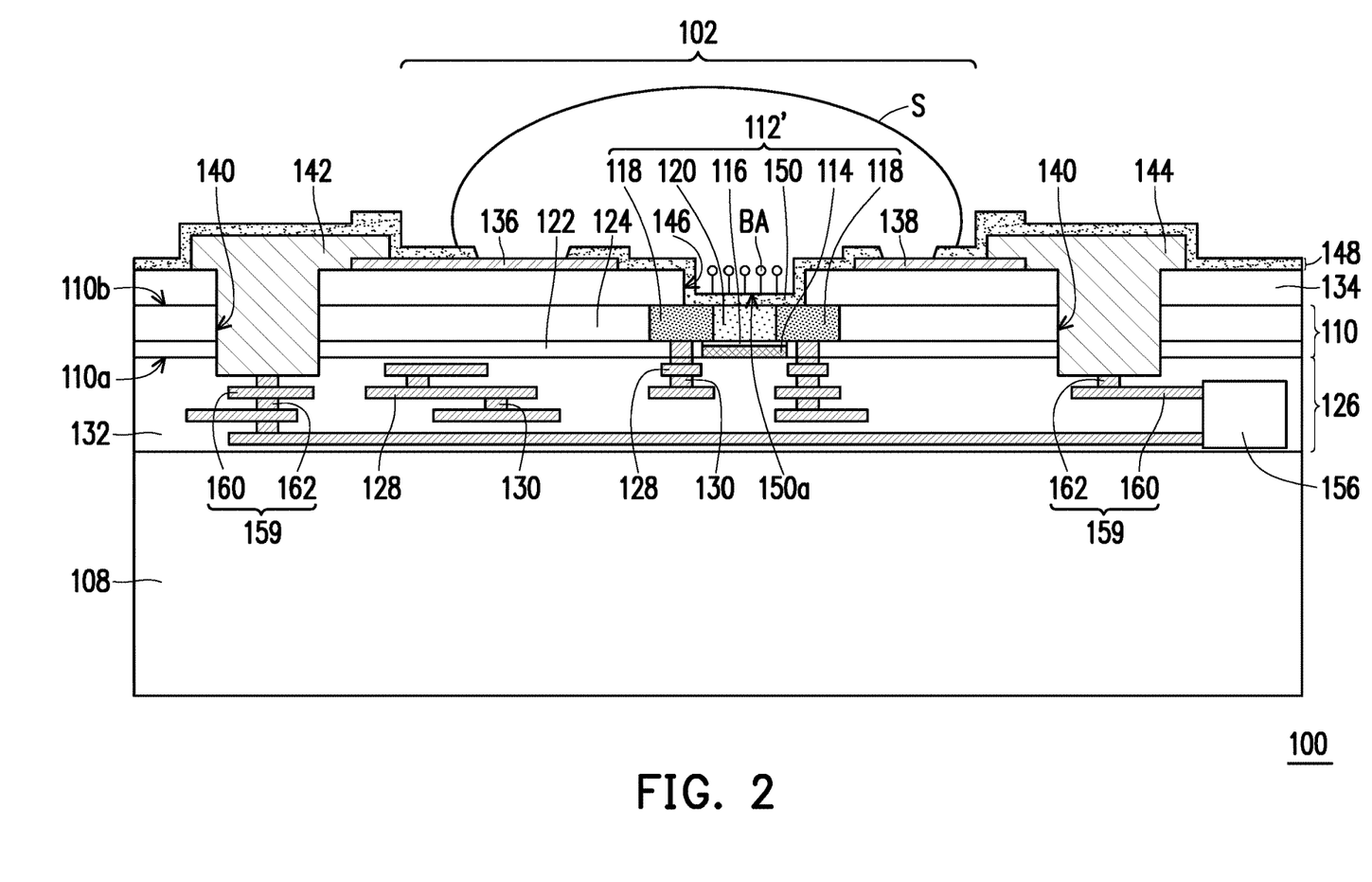
FIG. 2 illustrates a cross-sectional view of an integrated circuit device in accordance with some embodiments.

In some embodiments, as shown in FIG. 1G, the first conductive layer 136 and the second conductive layer 138 are electrically connected to the wire 152, 154 (i.e., external wire). However, the disclose is not limited thereto. In some alternative embodiments, the first conductive layer 136 and the second conductive layer 138 may be electrically connected to an internal controller. For example, as shown in FIG. 2, the controller 156 is formed aside/in the interconnect structure 126. That is, the controller 156 may be formed simultaneously with the conductive lines 128, the conductive vias 130 and/or the dielectric layer 132 of the interconnect structure 126. The controller 156 is electrically isolated from the interconnect structure 126. In some embodiments, the bonding pad 142, 144 may be electrically connected to the controller 156 through a conductive structure 159. The conductive structure 159 include conductive lines 160 and conductive vias 162 in the dielectric layer 132. The conductive lines 160 may be simultaneously formed with the conductive lines 128, and the conductive vias 162 may be simultaneously formed with the conductive vias 130. The conductive lines 160 and the conductive vias 162 are electrically isolated from the interconnect structure 126. In such embodiments, the exposure of the bonding pad 142, 144 is not required, and thus the passivation layer 148 may cover the bonding pad 142, 144 entirely. For example, the bonding pad 142, 144 fills the opening 140, and the bonding pad 142, 144 has a substantially flat top surface. In some alternative embodiments (not shown), the integrated circuit device 100 may further include a tank to surround the device region 102.

Figure 3:
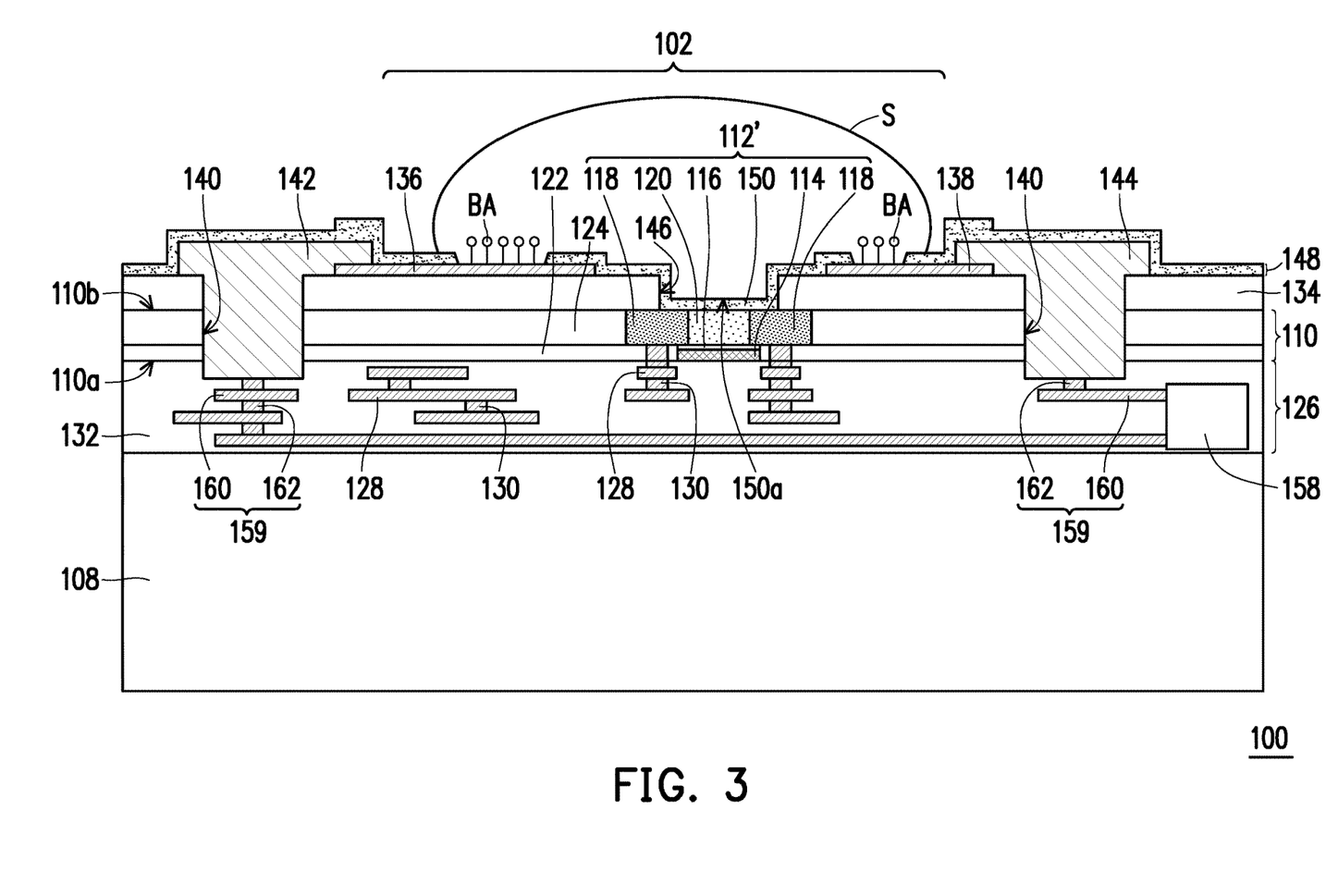
FIG. 3 illustrates a cross-sectional view of an integrated circuit device in accordance with some embodiments.

FIG. 3 illustrates a cross-sectional view of an integrated circuit device in accordance with some embodiments. The integrated circuit device of FIG. 3 is similar to the integrated circuit device 100 of FIG. 2, and the main difference lies in that the selective binding agent BA is coated on the first conductive layer 136 and the second conductive layer 138. In some embodiments, the first conductive layer 136 and the second conductive layer 138 are electrodes configured for binding with a plurality of selective binding agent BA. In some embodiments, a material of the first conductive layer 136 and the second conductive layer 138 includes a material suitable for being coated with biological molecules such as Pt, Au, polypyrrole (PPy) and oxidized derivatives of PPy. In some embodiments, the sample S may have an electrical-mediated reaction with the selective binding agent BA. The electrical-mediated reaction causes the release of the charge and/or proton which are then sensed by the bioFET 112'. In such embodiments, the first conductive layer 136 and the second conductive layer 138 may be connected to a circuitry 158 such as an electrode stimulation and readout circuitry. For example, the first conductive layer 136 and the second conductive layer 138 are electrically connected to the circuitry 158 through the interconnect structure 126. However, in some alternative embodiments (not shown), the first conductive layer 136 and the second conductive layer 138 are electrically connected to the circuitry 158 through external elements similar to the bonding pads 142, 144 and the wires 152, 154 of FIG. 1G.

Figure 4:
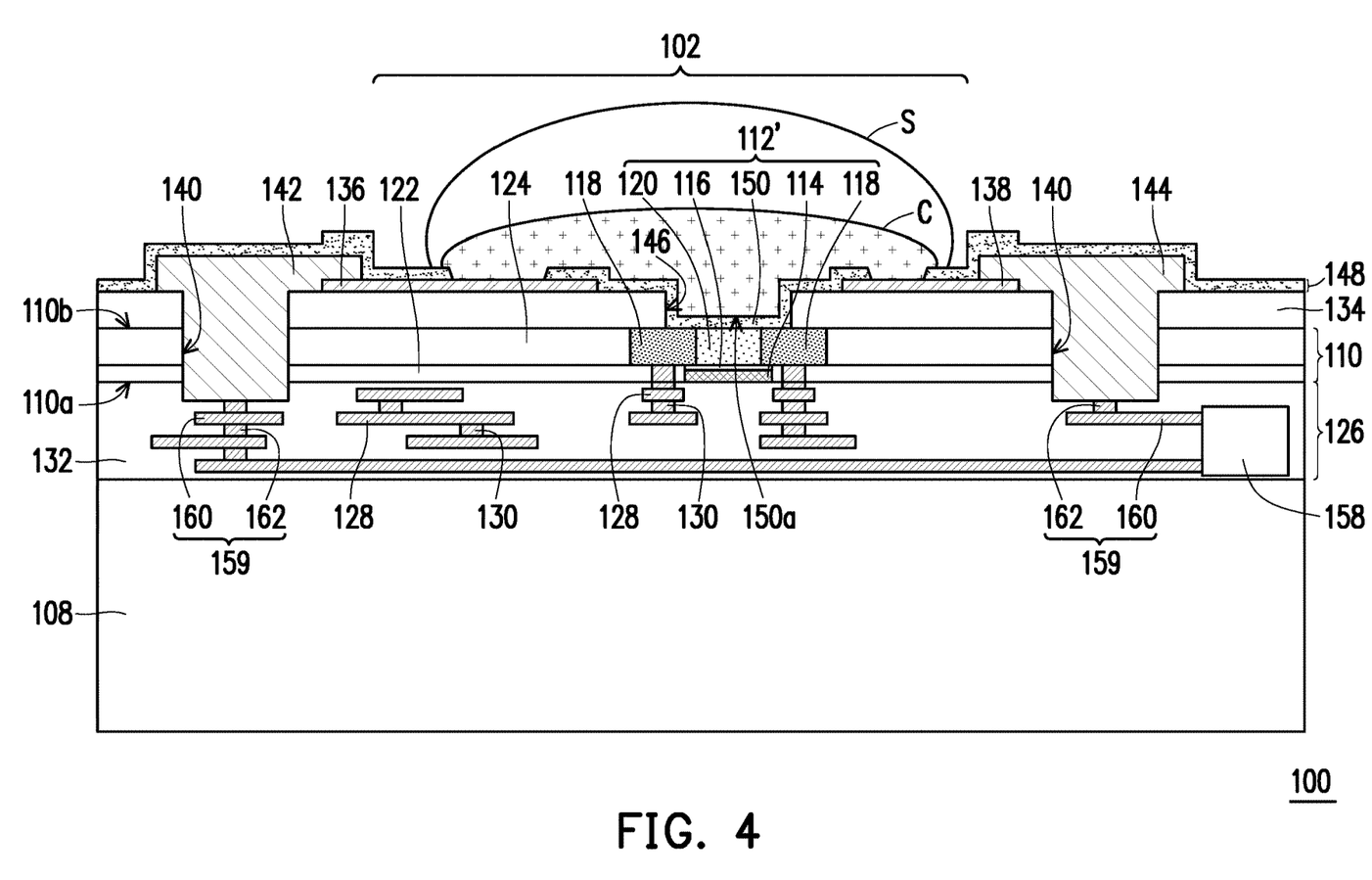
FIG. 4 illustrates a cross-sectional view of an integrated circuit device in accordance with some embodiments.

FIG. 4 illustrates a cross-sectional view of an integrated circuit device in accordance with some embodiments. The integrated circuit device of FIG. 4 is similar to the integrated circuit device 100 of FIG. 2, and the main difference lies in that there is no selective binding agent coated on the passivation layer 148 over the channel region 120 of bioFET 112'. In some embodiments, the first conductive layer 136 and the second conductive layer 138 are configured for electrical contact with adjacent fluid, such as the fluid sample S in the device region 102. For example, a cell C of the fluid sample S is in contact with the first conductive layer 136 and the second conductive layer 138. The first conductive layer 136 and the second conductive layer 138 may be electrodes which are operative as reference electrodes to fix the potential of a bulk fluid, which can facilitate certain modes of detection. A material of the first conductive layer 136 and the second conductive layer 138 may facilitate this functionality. In some embodiments, the first conductive layer 136 and the second conductive layer 138 includes a material suitable for being coated with biological molecules such as Pt, Au, polypyrrole (PPy) and oxidized derivatives of PPy. In some embodiments, the cell C may have an electrical-mediated reaction with the first conductive layer 136 and the second conductive layer 138. The electrical-mediated reaction leads the change of the potential and/or impedance which are then sensed by the bioFET 112'. In such embodiments, the first conductive layer 136 and the second conductive layer 138 may be connected to a circuitry 158 such as an electrode stimulation and readout circuitry. For example, the first conductive layer 136 and the second conductive layer 138 are electrically connected to the circuitry 158 through the interconnect structure 126. In some alternative embodiments (not shown), the first conductive layer 136 and the second conductive layer 138 are electrically connected to the circuitry 158 through external elements similar to the bonding pads 142, 144 and the wires 152, 154 of FIG. 1G.

Figure 5A:
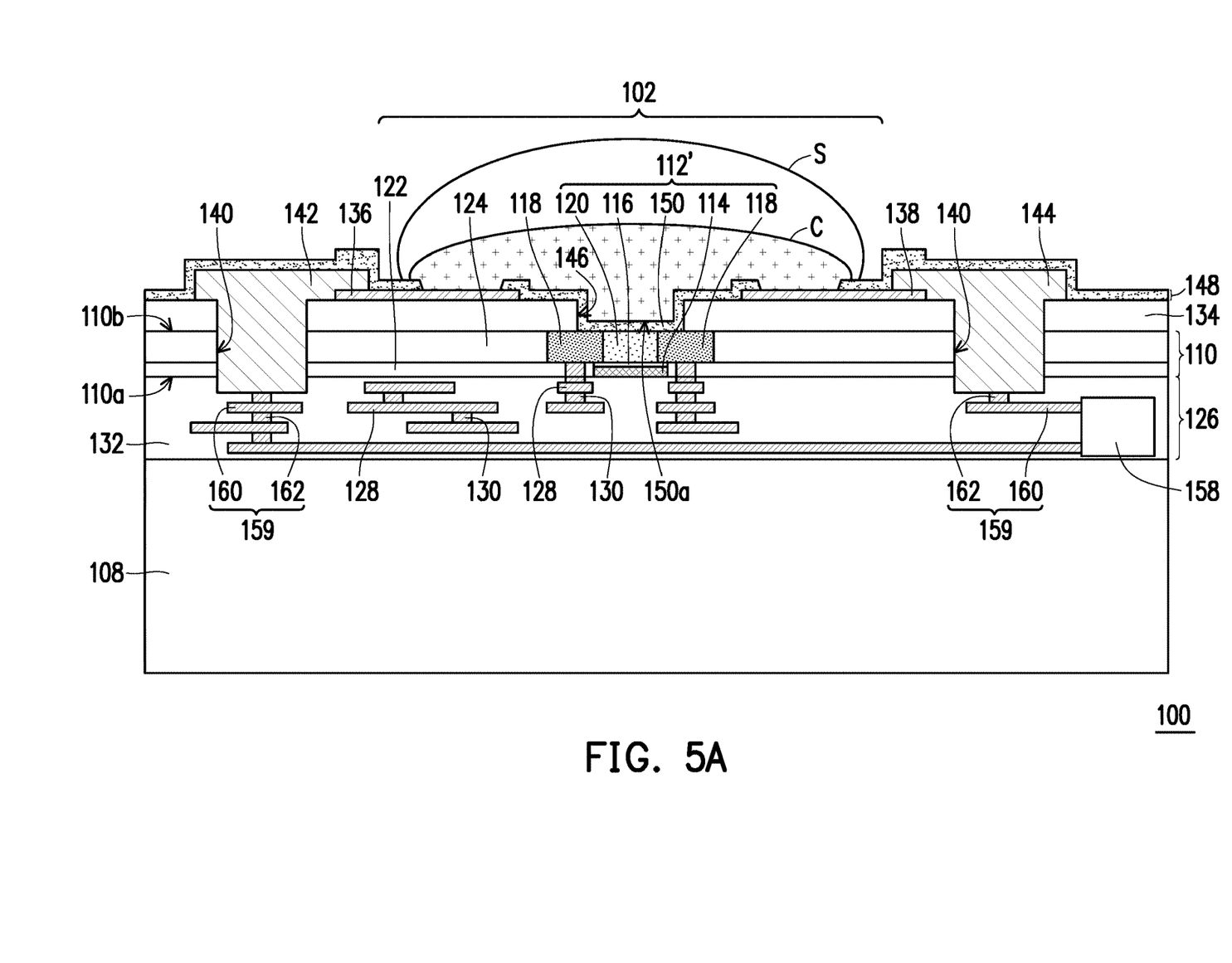
FIG. 5A illustrates a cross-sectional view of an integrated circuit device in accordance with some embodiments.
Figure 5B:
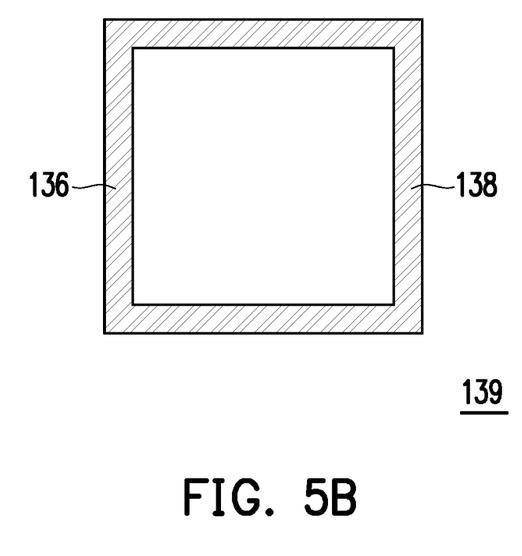
FIG. 5B illustrates a top view of first and second conductive layers in accordance with some embodiments.

FIG. 5A illustrates a cross-sectional view of an integrated circuit device in accordance with some embodiments, and FIG. 5B illustrates a top view of first and second conductive layers in accordance with some embodiments. The integrated circuit device of FIG. 5A is similar to the integrated circuit device 100 of FIG. 4, and the main difference lies in that the first conductive layer 136 is integrated formed with the second conductive layer 138 to form a ring-shaped electrode 139 as shown in FIG. 5B. In other words, the first conductive layer 136 and the second conductive layer 138 are portions of the ring-shaped electrode 139. Thus, as shown in FIG. 5A, the ring-shaped electrode 139 is electrically connected to the circuitry 158 through one of the first conductive layer 136 and the second conductive layer 138.

In the above embodiments, one first conductive layer 136 and one second conductive layer 138 are illustrated. In some alternative embodiments, the integrated circuit device 100 includes a plurality of first conductive layers 136 and a plurality of second conductive layers 138 aside the bioFET 112'. The first conductive layer 136 and the second conductive layer 138 may be respectively a heater, a temperature sensor or an electrode for bio-molecules immobilization. In an embodiment, the integrated circuit device 100 includes a plurality of heaters, a plurality of temperature sensors and a temperature controller electrically connected to the heaters and the temperature sensors. In another embodiment, the integrated circuit device 100 includes a plurality of electrodes and an electrode stimulation and readout circuitry electrically connected to the electrodes. In still another embodiment, the integrated circuit device 100 includes a plurality of heaters, a plurality of temperature sensors and a temperature controller electrically connected to the heaters and the temperature sensors, and a plurality of electrodes and an electrode stimulation and readout circuitry electrically connected to the electrodes.

In some embodiments, the heater, the temperature sensor and/or the electrode for bio-molecules immobilization are integrated on a CMOS platform (also referred to as a bioFET platform), to achieve system on chip (SoC) or lab on a chip (LoC). The formed integrated circuit device may perform thermal-mediated and/or electrical mediated detections such as polymerase chain reaction (PCR), large-scale measurement of broadband performance (LMAP), isothermal amplification and neuron cell drug test. In addition, the detections may be performed on small scale such as sub-microns for bio-molecule detection and several microns for biological cell detection with high resolution. In some embodiments, a plurality of bioFETs may be arranged in an array, and thus array-based signals may be detected. Accordingly, a statistical date for bioanalysis may be provided with high throughput and low cost.

In accordance with some embodiments of the disclosure, an integrated circuit device includes a device layer, an interconnect structure, a conductive layer, a passivation layer and a bioFET. The device layer has a first side and a second side and include source/drain regions and a channel region between the source/drain regions. The interconnect structure is disposed at the first side of the device layer. The conductive layer is disposed at the second side of the device layer. The passivation layer is continuously disposed on the conductive layer and the channel region and exposes a portion of the conductive layer. The bioFET includes the source/drain regions, the channel region and a portion of the passivation layer on the channel region.

In accordance with some embodiments of the disclosure, an integrated circuit device includes a device layer, an interconnect structure, a heater, a temperature sensor, a first bonding pad and a passivation layer. The device layer has a first side and a second side and includes a transistor. The interconnect structure is disposed at the first side of the device layer. The heater and the temperature sensor are disposed at the second side of the device layer. The first bonding pad is disposed at the first side of the device layer and electrically connected to the interconnect structure and the heater. The passivation layer is disposed over the first bonding pad, the heater and the temperature sensor. A portion of the heater and a portion of the temperature sensor are exposed by the passivation layer.

In accordance with some embodiments of the disclosure, a method of manufacturing an integrated circuit device includes at least the following steps. A dielectric layer is formed over an interconnect structure and a device layer, and the device layer includes source/drain regions and a channel region between the source/drain regions. A conductive layer is formed over the dielectric layer. An opening is formed in the dielectric layer to expose a portion of the interconnect structure. A bonding pad is formed in the opening to electrically connect to the interconnect structure and the conductive layer. A passivation layer is formed over the bonding pad and the conductive layer, wherein a portion of the conductive layer is exposed by the passivation layer, and a bioFET including the source/drain regions, the channel region and a portion of the passivation layer over the channel region is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   a device layer having a first side and a second side, comprising source/drain regions and a channel region between the source/drain regions;
   an interconnect structure at the first side of the device layer;
   a conductive layer at the second side of the device layer;
   a passivation layer, continuously disposed on the conductive layer and the channel region, and exposing a portion of the conductive layer;
   a bioFET (a biologically sensitive field effect transistor), comprising the source/drain regions, the channel region and a portion of the passivation layer on the channel region; and
   a bonding pad, electrically connected to the conductive layer and the interconnect structure, wherein the passivation layer is continuously extended on a top surface of a dielectric layer between the bonding pad and the device layer, a sidewall of the dielectric layer and a sidewall of the device layer, and the passivation layer exposes a portion of the bonding pad.

2. The integrated circuit device according to claim 1, wherein a material of the passivation layer comprises $SiO_2$, $Al_2O_3$, $Ta_2O_5$, $HfO_2$, $Si_3N_4$, $Y_2O_3$, $ZrO_2$, $TiO_2$, $La_2O_3$ or a combination thereof.

3. The integrated circuit device according to claim 1, wherein the passivation layer is in contact with the channel region.

4. The integrated circuit device according to claim 1, wherein the passivation layer is in contact with the conductive layer.

5. The integrated circuit device according to claim 1, wherein the conductive layer is a heater, a temperature sensor or a reference electrode.

6. The integrated circuit device according to claim 1 further comprising a tank over the passivation layer to surround a device region.

7. An integrated circuit device, comprising:
   a device layer having a first side and a second side, comprising a transistor;
   an interconnect structure at the first side of the device layer;
   a conductive layer at the second side of the device layer;
   a first bonding pad at the first side of the device layer, electrically connected to the interconnect structure and the conductive layer; and a passivation layer, disposed over the first bonding pad and the conductive layer, wherein the passivation layer is continuously extended on a top surface of the conductive layer, a top surface of the first bonding pad on the conductive layer, a sidewall of a dielectric layer between the first bonding pad and the device layer and a sidewall of the device layer, a portion of the conductive layer is exposed by the passivation layer, and the transistor and a portion of the passivation layer directly on the transistor form a bioFET.

8. The integrated circuit device according to claim 7, wherein the dielectric layer comprises a well exposing the transistor.

9. The integrated circuit device according to claim 7, wherein the first bonding pad is inserted between the passivation layer and the conductive layer.

10. The integrated circuit device according to claim 7, wherein the first bonding pad is continuously extended onto the sidewall of the dielectric layer, the sidewall of the device layer and a top surface of the interconnect structure.

11. The integrated circuit device according to claim 7, wherein the first bonding pad is in contact with the conductive layer.

12. The integrated circuit device according to claim 7, wherein a portion of the first bonding pad is exposed by the passivation layer.

13. The integrated circuit device according to claim 7, wherein the first bonding pad is entirely covered by the passivation layer.

14. The integrated circuit device according to claim 7 further comprising an additional conductive layer exposed by the passivation layer and a tank on the passivation layer, wherein the conductive layer and the additional conductive layer are a heater and a temperature sensor, and the tank surrounds the conductive layer and the additional conductive layer.

15. A method of manufacturing an integrated circuit device, comprising:
   forming a dielectric layer over an interconnect structure and a device layer, the device layer comprising source/drain regions and a channel region between the source/drain regions;
   forming a conductive layer over the dielectric layer;
   forming an opening in the dielectric layer to expose a portion of the interconnect structure;
   forming a bonding pad in the opening to electrically connect to the interconnect structure and the conductive layer; and
   forming a passivation layer over the bonding pad and the conductive layer, wherein the passivation layer is continuously extended on a top surface of the dielectric layer between the bonding pad and the device layer, a sidewall of the dielectric layer and a sidewall of the device layer, a portion of the conductive layer is exposed by the passivation layer, and a bioFET comprising the source/drain regions, the channel region and a portion of the passivation layer over the channel region is formed.

16. The method according to claim 15, wherein the bonding pad is conformally formed on a sidewall and a bottom of the opening.

17. The method according to claim 15, wherein a portion of the bonding pad is exposed by the passivation layer.

18. The method according to claim 15, wherein the bonding pad fills the opening completely.

19. The method according to claim 15, wherein the conductive layer is a heater, a temperature sensor or a reference electrode.

20. The method according to claim 15 further comprising forming a well in the dielectric layer to expose a portion of the bioFET, wherein the portion of the passivation layer is conformally formed on the well.

* * * * *